United States Patent [19]

Kamiya

[11] Patent Number: 5,698,991
[45] Date of Patent: Dec. 16, 1997

[54] BUS DRIVER

[75] Inventor: Hiroshi Kamiya, Tokyo, Japan

[73] Assignee: NEC Corporation, Tokyo, Japan

[21] Appl. No.: 607,464

[22] Filed: Feb. 27, 1996

[30] Foreign Application Priority Data

Feb. 28, 1995 [JP] Japan ................................. 7-067076

[51] Int. Cl.$^6$ ........................... H03K 17/16; H03K 19/08
[52] U.S. Cl. ............................ 326/26; 326/82; 327/381
[58] Field of Search .................... 326/26–27, 21, 326/82–83, 86–88, 90; 327/380–381

[56] References Cited

U.S. PATENT DOCUMENTS

| | | | |
|---|---|---|---|
| 5,124,585 | 6/1992 | Kim et al. | 326/86 |
| 5,220,216 | 6/1993 | Woo | 326/87 |
| 5,319,258 | 6/1994 | Ruetz | 326/82 |
| 5,483,188 | 1/1996 | Frodsham | 327/380 |
| 5,576,634 | 11/1996 | Kamiya | 326/26 |
| 5,587,678 | 12/1996 | Dijkmans | 327/380 |

*Primary Examiner*—Edward P. Westin
*Assistant Examiner*—Jon Santamauro
*Attorney, Agent, or Firm*—Sughrue, Mion, Zinn, Macpeak & Seas, PLLC

[57] ABSTRACT

A bus driver includes a plurality of first to m-th buffer circuits for receiving input of an input signal, a delay circuit for delaying the input signal by a predetermined time period, an n-th buffer circuit for receiving input of a delay signal from the delay circuit, a capacitor for selectively receiving input of a predetermined combination of the output signals of the first to m-th buffer circuits, and an output terminal for outputting a signal composed of the output of the capacitor and the output signal of said n-th buffer circuit. As a result of composition of a plurality of signals output from the capacitive portion and the signal output from the n-th buffer circuit, a plurality of output signals each having different rise time and fall time are output from the output terminal.

11 Claims, 8 Drawing Sheets

(a) SIGNAL S1
(b) SIGNAL S2
(c) SIGNAL S5
(d) SIGNAL S7
(e) SIGNAL S8

BUS DRIVER

BACKGROUND OF THE INVENTION

1. Field of the Invention

The present invention relates to a bus driver, and more particularly, to a bus driver allowing adjustment of through rates of a rise and a fall of an output waveform.

2. Description of the Related Art

Basic structure of a conventional bus driver is shown in FIG. 9. As illustrated in FIG. 9, the conventional bus driver is structured to have a buffer circuit 91 connected between an input terminal 92 and an output terminal 93. In this structured bus driver, because of an open drain structure of the buffer circuit 91, adjustment of a through rate (adjustment of a rise time and a fall time) is possible neither at a rise nor a fall of an output waveform.

The technology called GTL (Gunning Transceiver Logic) is proposed for improving adjustment of through rates of such a bus driver. GTL, however, only allows adjustment of a through rate at a rise of a waveform but not at a fall.

As described above, in a conventional bus driver, its open drain structure makes it difficult to adjust a through rate (adjustment of a rise time and a fall time) of a rise and a fall of an output waveform. This is a factor contributing to generation of noise on a bus, which makes it impossible to increase a frequency of a transmission waveform and therefore makes high-speed transmission difficult. Even with GTL, it is only possible to adjust a through rate of a rise of an output waveform but is difficult to adjust that of a fall. As a result, such a bus driver employing GTL has the same drawbacks that large noise is generated to prevent increase of a frequency of a transmission waveform.

SUMMARY OF THE INVENTION

The present invention is to provide a bus driver enabling adjustment of a rise time and a fall time of an output signal, by which noise on a bus transmission line can be prevented by appropriately setting a rise time and a fall time of an output signal, thereby allowing a frequency of a transmission waveform to be increased for high-speed transmission.

According to one aspect of the invention, a bus driver comprising:

an input terminal for receiving input of an input signal, a plurality of first to m-th (m is an integer larger than 1) buffer circuits for receiving input of said input signal from said input terminal, a delay circuit for delaying the input signal from said input terminal by a predetermined time period and outputting the delayed input signal as a delay signal, an n-th (n is an integer larger than m) buffer circuit for receiving input of said delay signal from said delay circuit, a capacitive portion for selectively receiving input of a predetermined combination of output signals from said first to m-th buffer circuits, and an output terminal for outputting a signal composed of the output of said capacitive portion and the output signal of said n-th buffer circuit.

In the preferred construction, at least one of the first to m-th buffer circuits includes first control means for permitting or inhibiting output, the control means selecting the output signals from the first to m-th buffer circuits to output a plurality of combinations of signals to the capacitive portion.

In the preferred construction, first and second buffer circuits are provided as the first to m-th buffer circuits, a third buffer circuit is provided as the n-th buffer circuit, and the second buffer circuit including first control means provided for permitting or inhibiting output, the capacitive portion receives input of the output signal of said first buffer circuit or a signal composed of the output signals of said first and second buffer circuits, and the output terminal outputs two types of signals each having different rise time and fall time which are composed of the output signal of said third buffer circuit and two types of output signals from the capacitive portion.

In another preferred construction, first to third buffer circuits are provided as said first to m-th buffer circuits, a fourth buffer circuit is provided as said n-th buffer circuit, the first to third buffer circuits including first control means for permitting or inhibiting output, the capacitive portion receives input of three types of signals as the combinations of the output signals from said first to third buffer circuits, and the output terminal outputs three types of signals each having different rise time and fall time which are combinations of the output signal of said fourth buffer circuit and three types of output signals from said capacitive portion.

According to a further aspect of the invention, a bus driver comprising:

an input terminal for receiving input of an input signal, a plurality of first to m-th (m is an integer larger than 1) buffer circuits for receiving input of said input signal from said input terminal, a delay circuit for delaying the input signal from said input terminal by a predetermined time period and outputting the delayed input signal as a delay signal, an n-th (n is an integer larger than m) buffer circuit for receiving input of said delay signal from said delay circuit, a capacitive portion for selectively receiving input of a predetermined combination of output signals from said first to m-th buffer circuits, and an output terminal for selectively outputting the output signals of said first to m-th buffer circuits or a signal composed of the output of said capacitive portion and the output signal of said n-th buffer circuit.

In the above-mentioned construction, at least one of said first to m-th buffer circuits includes first control means for permitting or inhibiting output.

In the preferred construction, the bus driver further comprises selection means for selectively switching outputting of the outputs of said first to m-th buffer circuits to said capacitive portion and outputting of the same directly to said output terminal.

In another preferred construction, at least one of said first to m-th buffer circuits includes first control means for permitting or inhibiting output, said control means selecting the output signals from said first to m-th buffer circuits to output a plurality of combinations of signals to said capacitive portion, the bus driver further comprises selection means for selectively switching outputting of the outputs of said first to m-th buffer circuits to said capacitive portion and outputting of the same directly to said output terminal, and wherein the n-th buffer circuit includes second control means for inhibiting the outputs of said n-th buffer circuit when said selection means outputs the outputs of said first to m-th buffer circuits directly to said output terminal.

In another preferred construction, first and second buffer circuits are provided as said first to m-th buffer circuits, and a third buffer circuit is provided as said n-th buffer circuit, the second buffer circuit including first control means provided for permitting or inhibiting output, the bus driver further comprises selection means for selectively switching outputting of the outputs of said first and second buffer circuits to said capacitive portion and outputting of the same directly to said output terminal, the third buffer circuit including second control means for inhibiting the output of said third buffer circuit when said selection means outputs the outputs of said first and second buffer circuits directly to said output terminal, and wherein the said capacitive portion receives input of the output signal of said first buffer circuit or a signal composed of the output signals of said first and second buffer circuits, and the output terminal outputs a total of four types of signals each having different rise time and fall time including two types of signals which are composed of the output signal of said third buffer circuit and two types of output signals from said capacitive portion, and two types of signals including the output signal of said first buffer circuit and a signal composed of the output signals of said first and second buffer circuits.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings.

DESCRIPTION OF THE PREFERRED EMBODIMENTS

Figure 1:
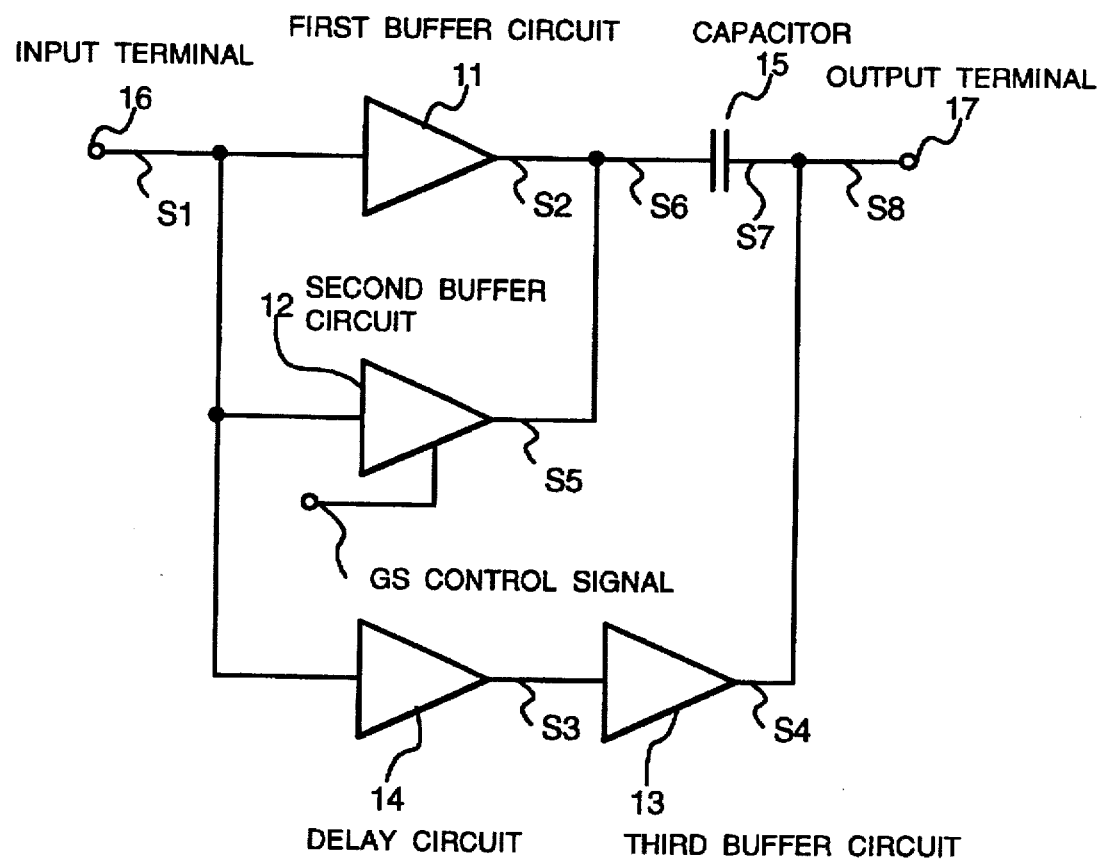
FIG. 1 is a circuit diagram of a bus driver according to a first embodiment of the present invention.

Preferred embodiments of the present invention will be described in detail with reference to the accompanying drawings in the following. FIG. 1 is a circuit diagram showing the structure of a bus driver according to the first embodiment of the present invention. In FIG. 1, the bus driver of the present invention includes a first buffer circuit 11, a second buffer circuit 12, a third buffer circuit 13, a delay circuit 14, a capacitor 15, an input terminal 16 and an output terminal 17.

The input terminal 16 is connected to the input portions of the first buffer circuit 11, the second buffer circuit 12 and the delay circuit 14. The output portions of the first buffer circuit 11 and the second buffer circuit 12 are connected to one terminal of the capacitor 15. The output portion of the delay circuit 14 is connected to the input portion of the third buffer circuit 13, an output control terminal of the second buffer circuit 12 is supplied with a control signal GS, and the other terminal of the capacitor 15 and the output portion of the third buffer circuit 13 are connected to the output terminal 17.

The second buffer circuit 12 has its output portion enabled or disabled by the control of the applied control signal GS. In the enable state, an output waveform is output from the output portion of the second buffer circuit 12 and in the disable state, no output waveform is output from the same.

Operation of thus structured bus driver of the first embodiment will be described with reference to FIGS. 2 and 3. Here, a gate delay time "Tg" of each of the first, second and third buffer circuits 11, 12 and 13 is set to be equal to each other and a rise time "Tr" of each output waveform output from these buffer circuits is set to be equal to each other. A fall time "Tf" of each output waveform output from these buffer circuits 11, 12 and 13 is also set to be equal to each other. In addition, a delay time of the delay circuit 14 is represented by "Td".

Figure 2:
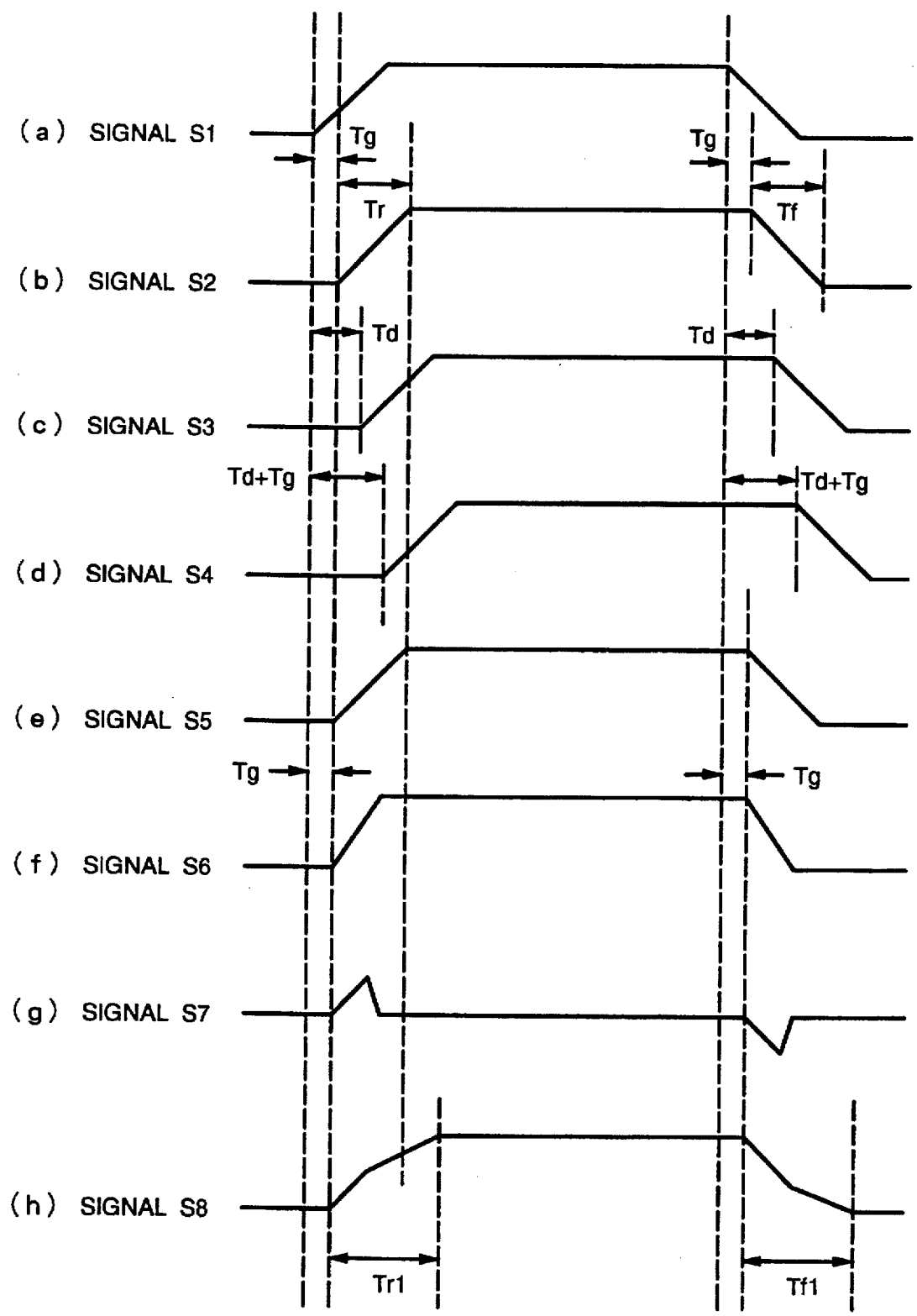
FIG. 2 is a waveform diagram for use in explaining operation of the bus driver according to the first embodiment of the present invention.

First, signal waveforms at the respective circuit portions are shown in FIG. 2 in a case where the output portion of the second buffer circuit 12 is enabled by the control signal GS. When a signal S1 whose waveform is shown in FIG. 2(a) is applied to the input terminal 16, the signal S1 is further applied to the first and second buffer circuits 11 and 12 and the delay circuit 14. From the output portion of the first buffer circuit 11, a signal S2 whose waveform is shown in FIG. 2(b) is output.

The signal S2 has a waveform delaying behind the waveform of the signal S1 at the input terminal 16 by the gate delay time "Tg" of the buffer circuit. From the output portion of the delay circuit 14, a signal S3 whose waveform is shown in FIG. 2(c) is output. The signal S3 delays behind the waveform of the signal S1 at the input signal 16 by the delay time "Td" of the delay circuit 14.

From the output portion of the third buffer circuit 13, a signal S4 whose waveform is shown in FIG. 2(d) is output, which signal has a waveform delaying behind the waveform of the signal S1 at the input terminal 16 by the time "Td+Tg".

Here, the output portion of the second buffer circuit 12 is enabled by the application of the control signal GS. The output portion of the second buffer circuit 12 therefore outputs a signal S5 whose waveform is shown in FIG. 2(e). The waveform of the signal S5 is the same as that of the signal S2 output from the buffer circuit 11.

Then, the signals S2 and S5 output from the first and second buffer circuits 11 and 12 are composed with each other, so that a signal S6 whose waveform is shown in FIG. 2(f) is applied to one terminal of the capacitor 15. As a result of the application of the signal S6, a signal S7 whose waveform is shown in FIG. 2(g) is output from the other terminal of the capacitor 15.

Then, composition of the signal S7 output from the capacitor 15 and shown in FIG. 2(g) and the signal S4 output from the third buffer circuit 13 and shown in FIG. 2(d) at the output terminal 17 results in outputting of an output signal S8 shown in FIG. 2(h). Rise time and fall time of the output signal S8 are represented by "Tr1" and "Tf1", respectively.

Description will now be given of operation at the time when the output portion of the second buffer circuit 12 is disabled by the control signal GS. Waveforms of the signals at the respective circuit portions are shown in FIG. 3 in a case where the output portion of the second buffer circuit 12 is disabled by the control signal GS. After the signal S1 whose waveform is shown in FIG. 3(a) is applied to the input terminal 16, the signal S1 is applied to the first and second buffer circuits 11 and 12 and the delay circuit 13, so that the signal S2 shown in FIG. 3(b) is output from the output portion of the first buffer circuit 11. The signal S2 has a waveform delaying behind the waveform of the signal S1 by the delay time "Tg".

On the other hand, from the output portion of the delay circuit 14, the signal S3 is output whose waveform delays behind that of the signal S1 shown in FIG. 3(c) by the delay time "Td". From the output portion of the third buffer circuit 13, the signal S4 is output whose waveform delays behind that of the signal shown in FIG. 3(d) by the time "Td+Tg".

Here, because the second buffer circuit 12 has its output portion disabled by the application of the control signal GS, the signal S5 is not output from the output portion of the second buffer circuit 12.

Therefore, the signal S6 whose waveform shown in FIG. 3(e) is the same as that of the signal S2 output from the first buffer circuit 11 is applied to one terminal of the capacitor 15. Then, output from the other terminal of the capacitor 15 is the signal S7 whose waveform is shown in FIG. 3(f).

Then, as a result of composition of the signal S7 output from the capacitor 15 and shown in FIG. 3(f) and the signal S4 output from the third buffer circuit 13 and shown in FIG. 3(d) at the output terminal 17, the output signal S8 shown in FIG. 3(g) is output. Rise time and fall time of the output signal S8 are represented by "Tr2" and "Tf2", respectively.

Comparison of the output signal S8 shown in FIG. 2(h) and the output signal S8 shown in FIG. 3(g) finds that the rise time "Tr2" and the fall time "Tf2" of the output signal S8 shown in FIG. 3(g) are longer that the rise time "Tr1" and the fall time "Tf1" of the output signal S8 shown in FIG. 2(h).

As described in the foregoing, rise and fall times of an output signal waveform (through rate) can be adjusted in two ways by switching the output portion of the second buffer circuit 12 between the enable state and the disable state by the control signal GS. As a result, appropriate adjustment of rise and fall times of the waveform of the output signal S8 leads to prevention of noise generation on a bus transmission path and therefore allows a transmission frequency to be increased for realizing a high-speed transmission bus.

Figure 4:
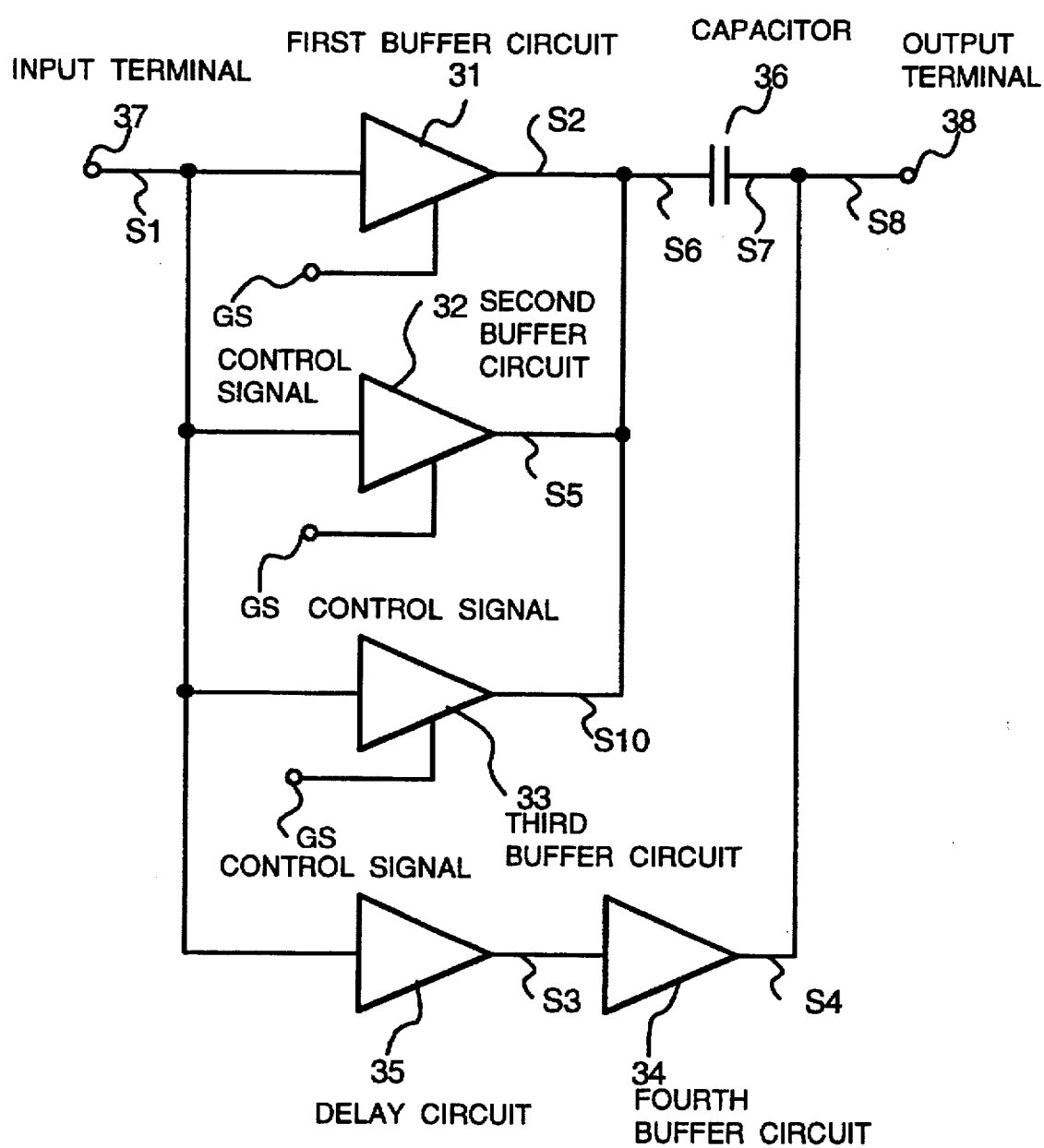
FIG. 4 is a circuit diagram of a bus driver according to a second embodiment of the present invention.

FIG. 4 is a circuit diagram showing the structure of a bus driver according to the second embodiment of the present invention. In FIG. 4, the bus driver of the second embodiment includes a first buffer circuit 31, a second buffer circuit 32, a third buffer circuit 33, a fourth buffer circuit 34, a delay circuit 35, a capacitor 36, and an input terminal 37 and an output terminal 38.

The input terminal 37 is connected to the input portions of the first, second and third buffer circuits 31, 32 and 33 and the delay circuit 35. The output portions of the first, second and third buffer circuits are connected to one terminal of the capacitor 36. The output portion of the delay circuit 35 is connected to the input portion of the fourth buffer circuit 34, and the other terminal of the capacitor 36 and the output portion of the buffer circuit 34 are connected to the output terminal 38. The output control terminals of the first to third buffer circuits 31, 32 and 33 are each supplied with a control signal GS. The output portions of the first to third buffer circuits 31 to 33 are enabled or disabled by the control of the applied control signal GS.

The second embodiment differs from the first embodiment in that an additional buffer circuit is connected to the capacitor 36 and that the output portion of the first buffer circuit 31 is enabled or disabled by the control signal GS.

In the second embodiment, the first to third buffer circuits 31 to 33 are set to have the same gate delay time "Tg", the same rise time "Tr" and the same fall time "Tf" of the output waveform. In addition, the delay time of the delay circuit 14 is represented by "Td". In this case, controlling each output portion to be enabled or disabled by the control signal GS leads to application of three types of signals to the capacitor 36 as a signal S6, which are a signal output from one of the first to third buffer circuits 31 to 33, a signal composed of two signals output from two of the first to third buffer circuits 31 to 33, and a signal composed of three signals output from the first to third buffer circuits 31 to 33.

Next, operation of thus structured bus driver according to the second embodiment will be described. First, description will be given of a case where one of the first, second and third buffer circuits 31, 32 and 33 is enabled by the control signal GS. In a case where, for example, the output portion of only the first buffer circuit 31 is enabled out of the first to third buffer circuits 31 to 33, the signal S2 output from the first buffer circuit 31 is applied as the signal S6 to one terminal of the capacitor 36. In addition, the output signal S7 of the capacitor 36 and the output signal S4 from the fourth buffer circuit 34 are composed with each other and output as the signal S8 through the output terminal 38.

Figure 3:
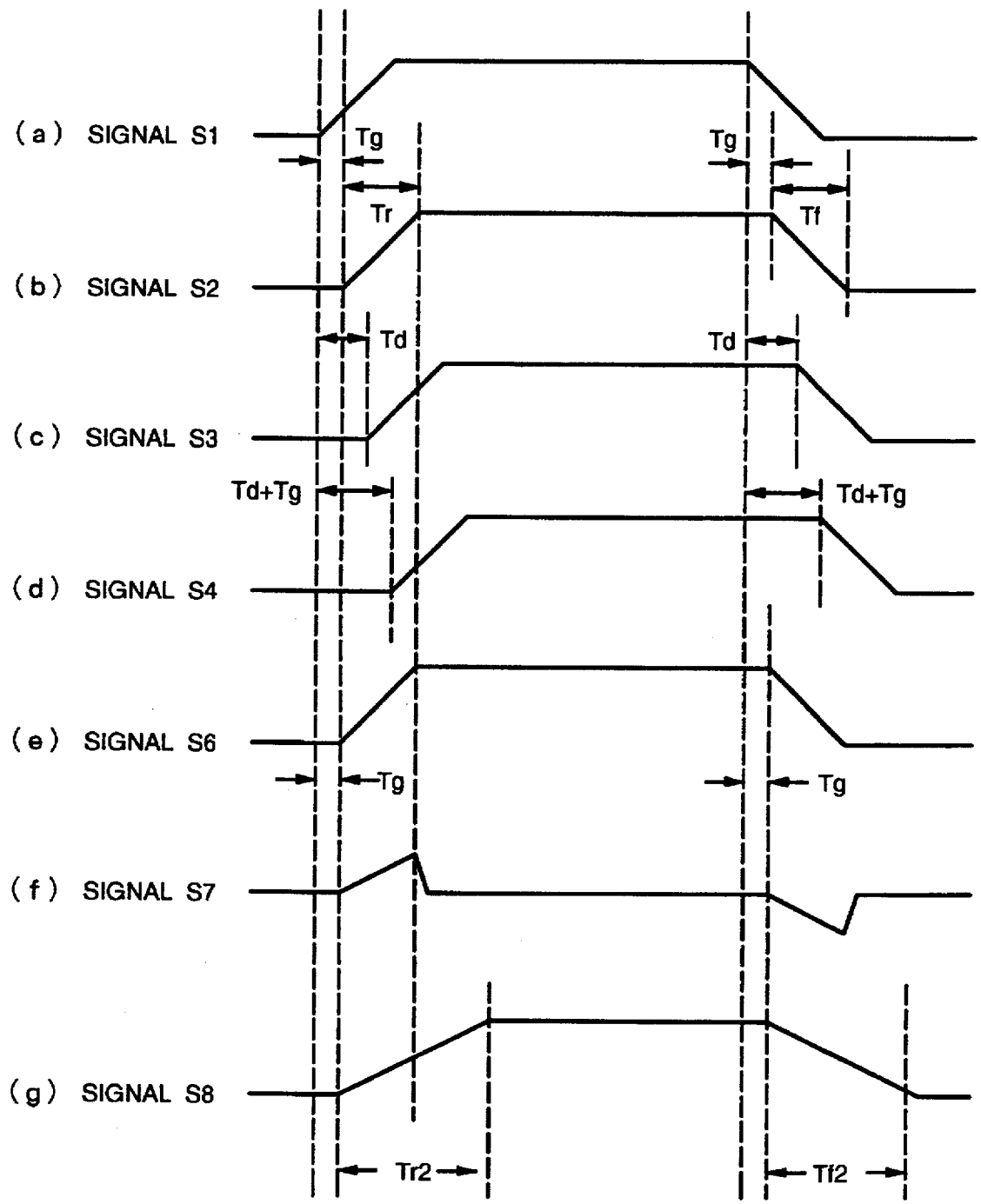
FIG. 3 is a waveform diagram for use in explaining operation of the bus driver according to the first embodiment of the present invention.

Signal waveforms at the respective circuit portions in a case where only the output portion of one of the first to third buffer circuits 31 to 33 is enabled will be therefore the same as those shown in FIG. 3. In other words, the rise time of the signal S8 output from the output terminal 38 will be represented by "Tr2" and the fall time by "Tf2".

Description will be given of a case where two of the first to third buffer circuits 31 to 33 are enabled by the control signal GS. In a case where, for example, output portions of the first and second buffer circuits 31 and 32 are enabled out of the first to third buffer circuits 31 to 33, a signal composed of the signal S2 output from the first buffer circuit 31 and the signal S5 output from the second buffer circuit 32 is applied as the signal S6 to one terminal of the capacitor 36. In addition, the output signal S7 of the capacitor 36 and the output signal S4 from the buffer circuit 34 are composed with each other and output as the signal S8 through the output terminal 38.

Signal waveforms at the respective circuit portions in a case where output portions of any two of the first to third buffer circuits 31 to 33 are enabled by the control signal GS will be therefore the same as those shown in FIG. 2. In other words, the rise time and the fall time of the signal S8 output from the output terminal 38 will be represented by "Tr1" and "Tf1", respectively.

Figure 5:
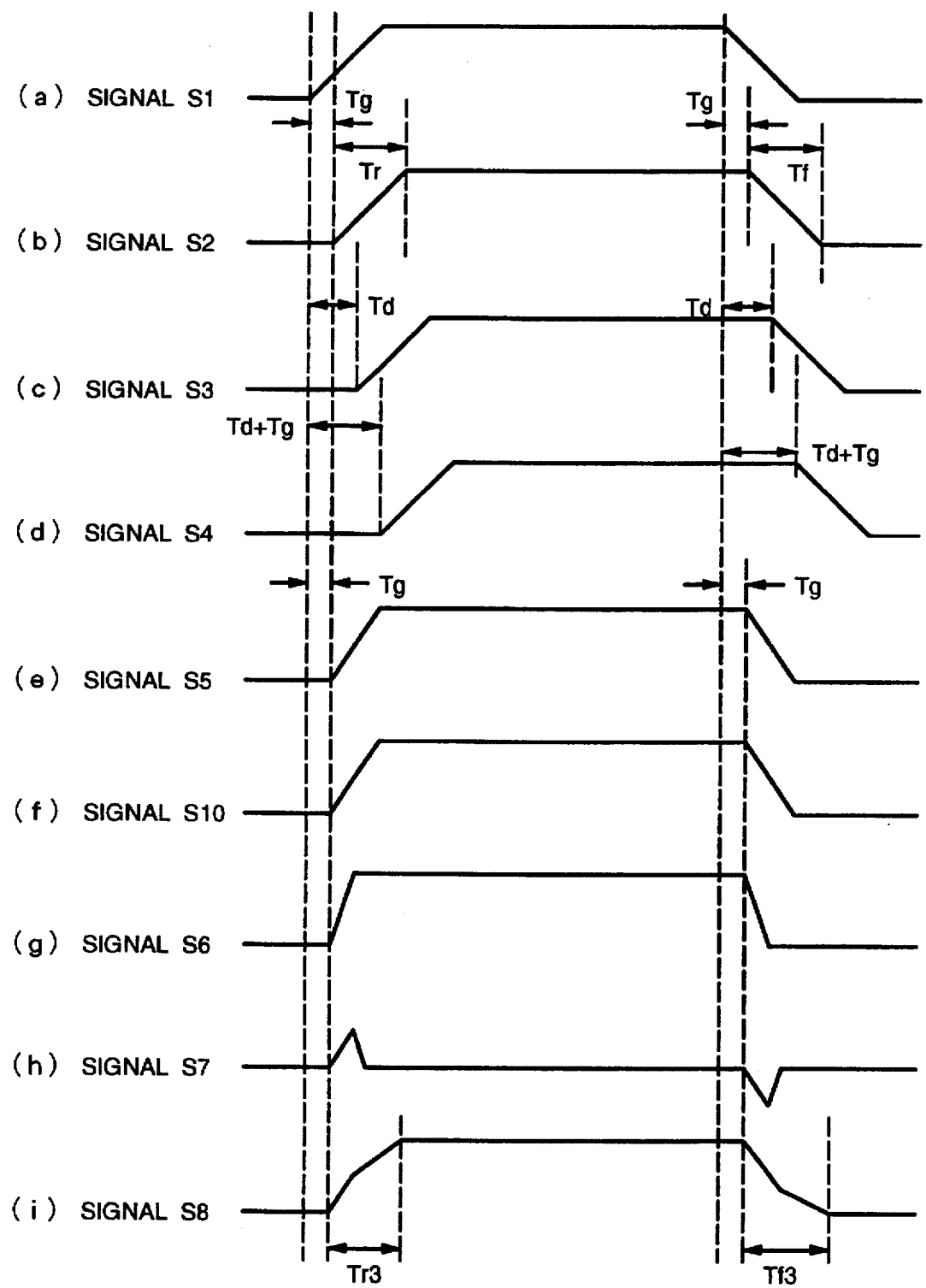
FIG. 5 is a waveform diagram for use in explaining operation of the bus driver according to the second embodiment of the present invention.

Description will be given of a case where all of the first to third buffer circuits 31 to 33 are enabled by the control signal GS. Signal waveforms at the respective circuit portions in this case are shown in FIG. 5.

When the signal S1 whose waveform is shown in FIG. 5(a) is applied to the input terminal 37, the signal S1 is further applied to the first to third buffer circuits 31 to 33 and the delay circuit 35. From the output portion of the first buffer circuit 31, the signal S2 is output whose waveform shown in FIG. 5(b) delays behind that of the signal S1 by the gate delay time "Tg".

From the output portion of the second buffer circuit 32, the signal S5 shown in FIG. 5(e) is output. Output from the output portion of the third buffer circuit 33 is the signal S10 shown in FIG. 5(f). The waveforms of the signals S5 and S10 are the same as that of the signal S2 output from the first buffer circuit 31.

Furthermore, output from the output portion of the delay circuit 35 is the signal S3 whose waveform shown in FIG. 5(c) delays behind that of the signal S1 by the delay time "Td" of the delay circuit 14. Output from the output portion of the fourth buffer circuit 34 is the signal S4 whose waveform shown in FIG. 5(d) delays behind that of the signal S1 by the time "Td+Tg".

Then, the signals S2, S5 and S10 respectively output from the first, second and third buffer circuits 31, 32 and 33 are composed with each other to be the signal S6 shown in FIG. 5(g), which signal is applied to one terminal of the capacitor 36. In response to the input of the signal S6, the signal S7 shown in FIG. 5(h) is output from the other terminal of the capacitor 36.

Then, as a result of composition of the signal S7 output from the capacitor 36 and shown in FIG. 5(h) and the signal S4 output from the fourth buffer circuit 34 and shown in FIG. 5(d) at the output terminal 38, the output signal S8 shown in FIG. 5(i) is output. The rise time and the fall time of the output signal S8 are represented by "Tr3" and "Tf3", respectively.

Comparison of the output signal S8 shown in FIG. 5(i) with the output signals S8 shown in FIGS. 2(h) and 3(g) finds that the rise time "Tr3" and the fall time "Tf3" of the output signal S8 shown in FIG. 5(i) are shorter than the rise times "Tr1" and "Tr2" and the fall times "Tf1" and "Tf2" of the output signals S8 shown in FIGS. 2(h) and 3(g), respectively.

Thus, as a result of composition of three types of output signals from the capacitor 36 and the output signal of the fourth buffer circuit 34 in response to the application of the three types of output signals each having difference rise time and fall time to the capacitor 36, three types of output signals each having different rise time and fall time are output from the output terminal 38. Finer through rate adjustment is therefore possible than that by the first embodiment.

Figure 6:
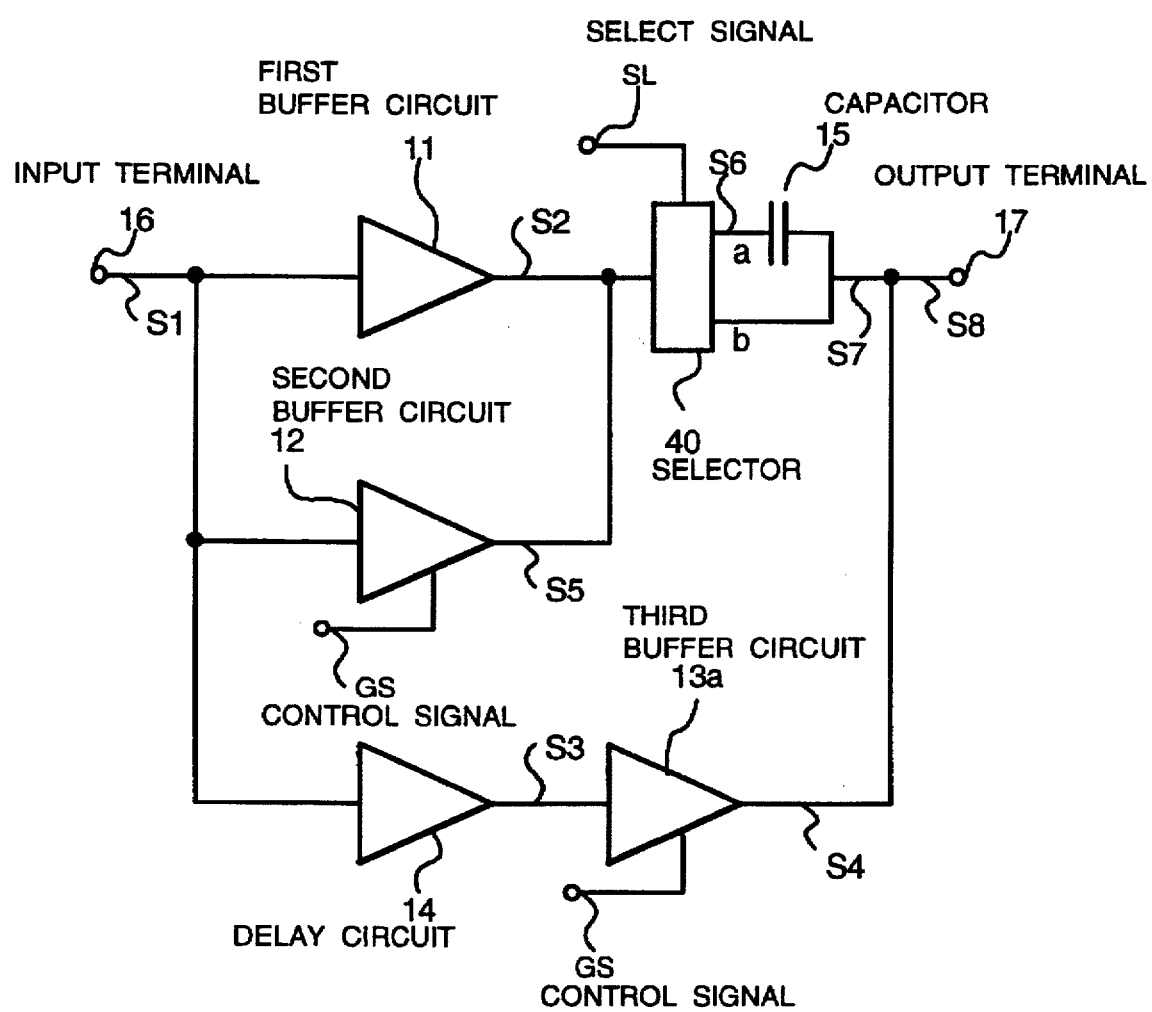
FIG. 6 is a circuit diagram of a bus drier according to a third embodiment of the present invention.

FIG. 6 is a circuit diagram showing the structure of a bus driver according to the third embodiment of the present invention. In FIG. 6, common reference numerals are allotted to the same components as those of the first embodiment shown in FIG. 1. No description will be therefore given to the same components.

The bus drive according to the third embodiment, as shown in the figure, is structured such that a selector 40 is provided for switching and outputting the output of either the first buffer circuit 11 or the second buffer circuit 12, and the output portion of a third buffer circuit 13a is enabled or disabled by the control signal GS.

Applied to the selector 40 is the output of the first buffer circuit 11 or the output composed of the outputs of the first buffer circuit 11 and the second buffer circuit 12. In addition, the selector 40 selectively outputs a signal to the "a" side or the "b" side in response to a select signal SL. The signal output from the "a" side is applied to one terminal of the capacitor 15. The signal output from the "b" side is sent directly to the output terminal 17.

The third buffer circuit 13a is controlled by the control signal GS in a manner as described in the following. That is, when the selector 40 outputs a signal to the "a" side (capacitor 15) in response to the select signal SL, the third buffer circuit 13a is enabled and when the selector 40 outputs the signal directly to the "b" side in response to the select signal SL, it is disabled. Here, the first, second and third buffer circuits 11, 12 and 13a are set to have the same gate delay time "Tg", and the same rise time "Tr" and the same fall time "Tf" of their output waveforms. In addition, delay time of the delay circuit 14 is represented by "Td".

In the structured bus driver described above, when the selector 40 is switched to the "b" side in response to the select signal SL, the third buffer circuit 13a is disabled in response to the control signal GS, so that the output signal of the first buffer circuit 11 is output through the selector 40 or an output composed of the outputs of the first and second buffer circuits 11 and 12 is output through the selector 40.

Figure 7:
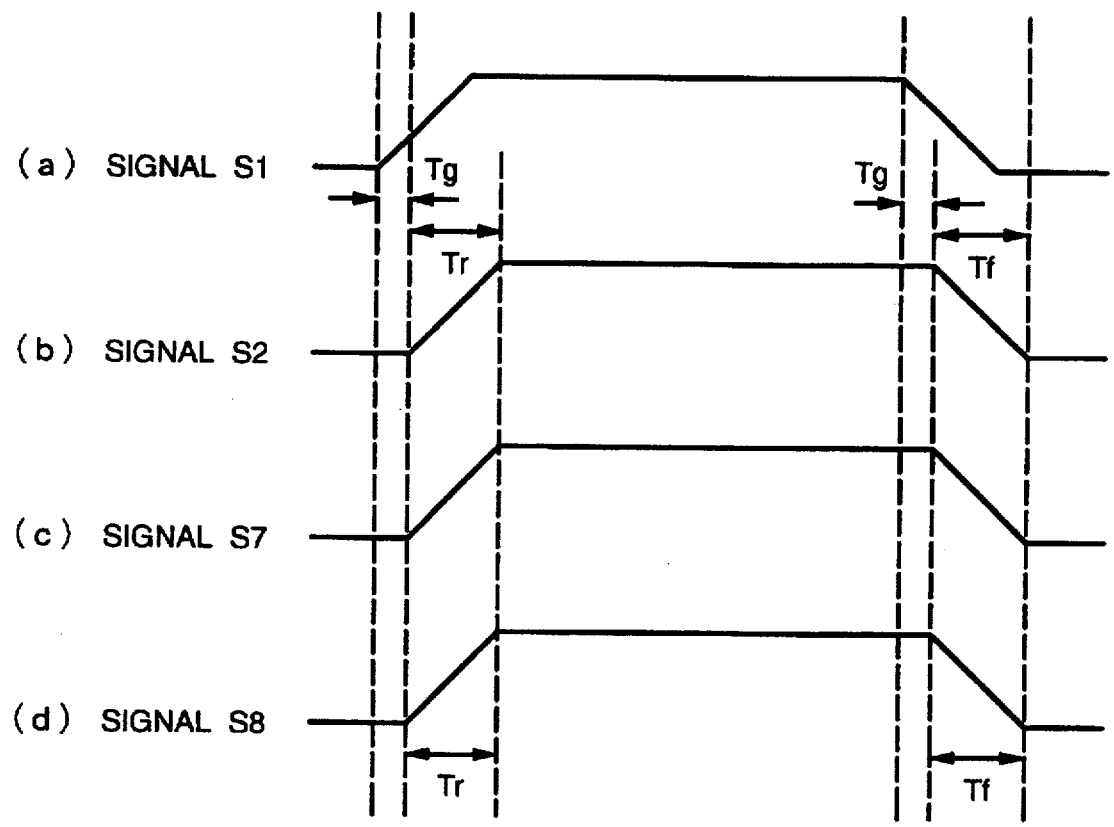
FIG. 7 is a waveform diagram for use in explaining operation of the bus driver according to the third embodiment of the present invention.

Next, operation of the structured bus driver according to the third embodiment will be described. Here, signal waveforms of the respective circuit portions are shown in FIG. 7 in a case where the selector 40 is switched to the "b" side in response to the select signal SL and the second buffer circuit 12 is disabled by the control signal GS.

When a signal S1 whose waveform is shown in FIG. 7(a) is applied to the input terminal 16, the signal S1 is further applied to the first and second buffer circuits 11 and 12 and the delay circuit 14. From the output portion of the first buffer circuit 11, a signal S2 is output whose waveform shown in FIG. 7(b) delays behind that of the signal S1 by the gate delay time "Tg".

At this time, because the output portions of the second buffer circuit 12 and the third buffer circuit 13a are disabled in response to the application of the control signal GS, neither a signal S5 nor S4 is output from the output portions of the second and third buffer circuits 12 and 13a.

Therefore, a signal S7 whose waveform shown in FIG. 7(c) is the same as that of the signal S2 output from the first buffer circuit 11 is output from the selector 40. Then, a signal S8 whose waveform shown in FIG. 7(d) is the same as that of the signal S7 is output from the output terminal 17. The output terminal S8 has the same waveform as that of the signal S2 and its rise time and fall time are represented by "Tr" and "Tf", respectively.

Figure 8:
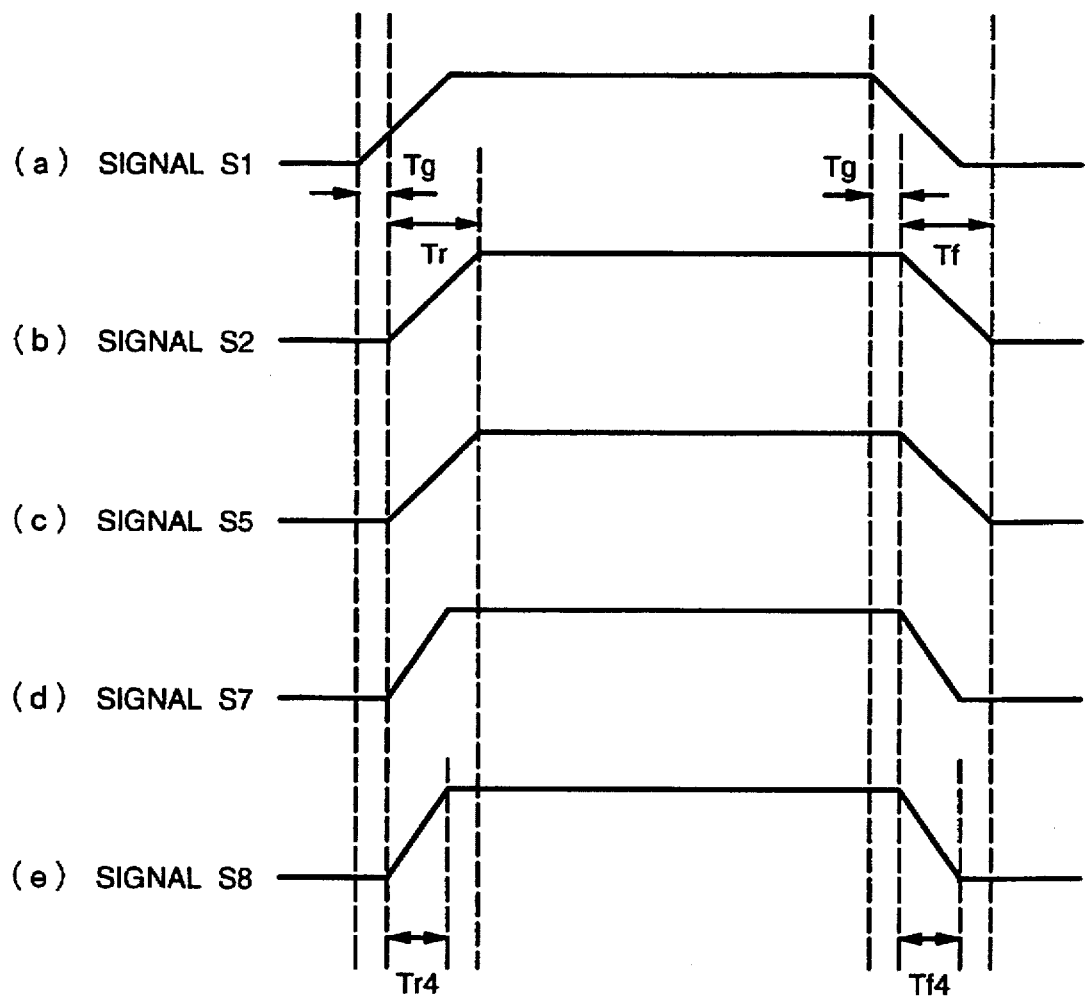
FIG. 8 is a waveform diagram for use in explaining operation of the bus driver according to the third embodiment of the present invention.
Figure 9:
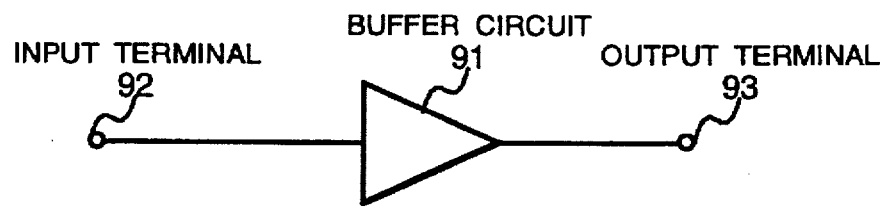
FIG. 9 is a circuit diagram showing one example of a conventional bus driver.

Shown in FIG. 8 are signal waveforms at the respective circuit portions in a case where the selector 40 is switched to the "b" side in response to the select signal SL and the second buffer circuit 12 is enabled by the control signal GS.

When the signal S1 shown in FIG. 8(a) is applied to the input terminal 16, the signal S1 is further applied to the first and second buffer circuits 11 and 12 and the delay circuit 14. From the output portion of the first buffer circuit 11, the signal S2 is output whose waveform shown in FIG. 8(b) delays behind that of the signal S1 by the gate delay time "Tg".

From the output portion of the second buffer circuit 12, the signal S5 is output whose waveform shown in FIG. 8(c) delays behind that of the signal S1 by the gate delay time "Tg" of the buffer circuit. With its output portion being disabled in response to the application of the control signal GS, the output portion 13a fails to output the signal S4 through its output portion.

As a result, a composite signal of the signal S2 output from the first buffer circuit 11 and the signal S5 output from the second buffer circuit 12 is applied to the selector 40, from which the signal S7 shown in FIG. 8(c) is directly output to the side of the output terminal 17. Then, the signal S8 whose waveform shown in FIG. 7(d) is the same as that of the signal S7 is output through the output terminal 17. The output signal S8, which has the same waveform as that of the signal S6 shown in FIG. 2, has the rise time and the fall time represented by "Tr4" and "Tf4", respectively. As a result, two types of output signals are output through the output terminal 17.

Next, the output signal of the first buffer circuit 11 or the output composed of the outputs of the first buffer circuit 11 and the second buffer circuit 12 is applied to the capacitor 15 through the selector 40, and two types of output signals output from the capacitor 15 and the output signal S4 from the third buffer circuit 13a are composed with each other, whereby two types of output signals each having different rise time and fall time are output from the output terminal 17.

Signal waveforms at the respective circuit portions will therefore be the same as those shown in FIG. 3 in a case where, with the second buffer circuit 12 being disabled, the signal S2 of the first buffer circuit 11 is applied as the signal S6 to the capacitor 15 through the selector 40, while the output signal S4 is output from the third buffer circuit 13a. In other words, the signal S8 output from the output terminal 17 will have the rise time of "Tr2" and the fall time of "Tf2".

In addition, signal waveforms at the respective circuit portions will be the same as those shown in FIG. 2 in a case where, with the second buffer circuit 12 being enabled, the signal S2 of the first buffer circuit 11 and the signal S5 of the second buffer circuit 12 are composed with each other and applied as the signal S6 to the capacitor 15 through the selector 40, and the output signal S4 is output from the third buffer circuit 13a. In other words, the rise time and the fall time of the signal S8 output from the output terminal 17 will be represented by "Tr1" and "Tf1", respectively.

More specifically, in the third embodiment, a total of four types of output signals with different rise times ("Tr4"<"Tr"<"Tr1"<"Tr2") and fall times ("Tf4" <"Tf"<"Tf1"<"Tf2") are output from the output terminal 17. Finer through rate adjustment than those by the first and second embodiments is therefore possible.

In the above embodiments, it is also possible to increase the number of buffer circuits to be connected to the capacitor. In such a case, a larger number of output signals can be output whose rise times and fall times are different from each other by arbitrarily combining outputs of buffer circuits connected to the capacitor. More detailed through rate adjustment will be therefore possible.

As described in the foregoing, because the bus driver of the present invention is structured such that outputs from the first to m-th buffer circuits are composed with each other according to a predetermined combination and applied as a plurality of types of signals to a capacitive portion and the plurality of types of signals output from the capacitive portion, and a signal output from the n-th buffer circuit are composed with each other to output a plurality of types of output signals each having different rise time and fall time, the bus driver is allowed to appropriately adjust a rise time and a fall time of a waveform at the output terminal, thereby preventing generation of noise on a bus transmission path to realize a high-speed bus.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A bus driver comprising:

an input terminal for receiving an input signal, a plurality of first to m-th buffer circuits for receiving as input said input signal from said input terminal, wherein m is an integer larger than 1, a delay circuit for delaying the input signal from said input terminal by a predetermined time period and outputting the delayed input signal as a delay signal, an n-th buffer circuit for receiving as input said delay signal from said delay circuit, wherein n is an integer larger than m, a capacitive device for selectively receiving as input a predetermined combination of output signals from said first to m-th buffer circuits, and an output terminal for outputting a signal composed of an output of said capacitive device and an output signal of said n-th buffer circuit.

2. The bus driver as set forth in claim 1, wherein at least one of said first to m-th buffer circuits receives a first control signal for permitting or inhibiting output of said at least one of said first to m-th buffer circuits, said control signal selectively controlling the output signals of said first to m-th buffer circuits to provide a plurality of combinations of the output signals to said capacitive device.

3. The bus driver as set forth in claim 1, wherein first and second buffer circuits are provided as said first to m-th buffer circuits, a third buffer circuit is provided as said n-th buffer circuit, said second buffer circuit receiving a first control signal provided for permitting or inhibiting output of said second buffer circuit, wherein said capacitive device receives as input one of the output signal of said first buffer circuit and a signal composed of the output signals of said first and second buffer circuits, and wherein said output terminal outputs two types of signals, each having a different rise time and fall time, which are each composed of the output signal of said third buffer circuit and one of two kinds of output signals from said capacitive device.

4. The bus driver as set forth in claim 1, wherein first to third buffer circuits are provided as said first to m-th buffer circuits, a fourth buffer circuit is provided as said n-th buffer circuit, said first to third buffer circuits receiving a first control signal for permitting or inhibiting output of at least one of said first to m-th buffer circuits, wherein said capacitive device receives as input three types of signals comprising combinations of the output signals from said first to third buffer circuits, and wherein said output terminal outputs three types of signals, each having a different rise time and fall time, which are combinations of the output signal of said fourth buffer circuit and three kinds of output signals from said capacitive device.

5. A bus driver comprising:

an input terminal for receiving an input signal, a plurality of first to m-th buffer circuits for receiving as input said input signal from said input terminal, wherein m is an integer larger than 1, a delay circuit for delaying the input signal from said input terminal by a predetermined time period and outputting the delayed input signal as a delay signal, an n-th buffer circuit for receiving as input said delay signal from said delay circuit, wherein n is an integer larger than m, a capacitive device for selectively receiving as input a signal composed of at least one of output signals of said first to m-th buffer circuits, and an output terminal for selectively outputting said signal composed of at least one of the output signals of said first to m-th buffer circuits or a signal composed of the output of said capacitive device and the output signal of said n-th buffer circuit.

6. The bus driver as set forth in claim 5, wherein at least one of said first to m-th buffer circuits receives a first control signal for permitting or inhibiting output of said at least one of said first to m-th buffer circuits.

7. The bus driver as set forth in claim 5, further comprising:

a selection circuit for selectively outputting said signal composed of at least one of the output signals of said first to m-th buffer circuits directly to one of said capacitive device and said output terminal.

8. The bus driver as set forth in claim 5, wherein at least one of said first to m-th buffer circuits receives a first control signal for permitting or inhibiting output of said at least one of said first to m-th buffer circuits, said control signal selectively controlling the output signals of said first to m-th buffer circuits to provide a plurality of combinations of the output signals to said capacitive device, said bus driver further comprising:

a selection circuit for selectively outputting said signal composed of at least one of the output signals of said first to m-th buffer circuits directly to one of said capacitive device and said output terminal.

9. The bus driver as set forth in claim 5, further comprising:

a selection circuit for selectively outputting said signal composed of at least one of the output signals of said first to m-th buffer circuits directly to one of said capacitive device and said output terminal, wherein said n-th buffer circuit receives a second control signal for inhibiting the output of said n-th buffer circuit when said selection circuit outputs the signal composed of at least one of the output signals of said first to m-th buffer circuits directly to said output terminal.

10. The bus driver as set forth in claim 5, wherein at least one of said first to m-th buffer circuits receives a first control signal for permitting or inhibiting output of said at least one of said first to m-th buffer circuits, said control signal selectively controlling the output signals of said first to m-th buffer circuits to provide a plurality of combinations of the output signals to said capacitive device, said bus driver further comprising:

a selection circuit for selectively outputting a signal composed of at least one of the output signals of said first to m-th buffer circuits directly to one of said capacitive device and said output terminal, said n-th buffer circuit receiving a second control signal for inhibiting the outputs of said n-th buffer circuit when said selection circuit outputs the signal composed of the at least one of the output signals of said first to m-th buffer circuits directly to said output terminal.

11. The bus driver as set forth in claim 5, wherein first and second buffer circuits are provided as said first to m-th buffer circuits, and a third buffer circuit is provided as said n-th buffer circuit, said second buffer circuit receiving a first control signal provided for permitting or inhibiting output of said second buffer circuit, said bus driver further comprising:

a selection circuit for selectively outputting a signal composed of at least one of the output signals of said first and second buffer circuits directly to one of said capacitive device and said output terminal, wherein said third buffer circuit receives a second control signal for inhibiting the output of said third buffer circuit when said selection circuit outputs said signal composed of at least one of the output signals of said first and second buffer circuits directly to said output terminal, wherein said capacitive device receives as input one of the output signal of said first buffer circuit and a signal composed of the output signals of said first and second buffer circuits, and wherein said output terminal outputs a plurality of types of signals, each having different rise times and fall times, including two types of signals which are each composed of the output signal of said third buffer circuit and one of two kinds of output signals from said capacitive device, and two types of signals which each include one of the output signal of said first buffer circuit and a signal composed of the output signals of said first and second buffer circuits.

* * * * *